United States Patent
Plößl et al.

(10) Patent No.: US 11,069,663 B2
(45) Date of Patent: Jul. 20, 2021

(54) METHOD OF PRODUCING AN OPTOELECTRONIC SEMICONDUCTOR COMPONENT, AND OPTOELECTRONIC SEMICONDUCTOR COMPONENT

(71) Applicant: OSRAM Opto Semiconductors GmbH, Regensburg (DE)

(72) Inventors: Andreas Plößl, Regensburg (DE); Siegfried Herrmann, Neukirchen (DE); Martin Rudolf Behringer, Regensburg (DE); Frank Singer, Regenstauf (DE); Thomas Schwarz, Regensburg (DE); Alexander F. Pfeuffer, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 92 days.

(21) Appl. No.: 16/468,085

(22) PCT Filed: Jan. 12, 2018

(86) PCT No.: PCT/EP2018/050752
§ 371 (c)(1),
(2) Date: Jun. 10, 2019

(87) PCT Pub. No.: WO2018/134132
PCT Pub. Date: Jul. 26, 2018

(65) Prior Publication Data
US 2019/0333898 A1   Oct. 31, 2019

(30) Foreign Application Priority Data
Jan. 17, 2017   (DE) ..................... 10 2017 100 812.8

(51) Int. Cl.
*H01L 25/075*   (2006.01)
*H01L 33/62*   (2010.01)
*H01L 33/00*   (2010.01)

(52) U.S. Cl.
CPC ...... *H01L 25/0753* (2013.01); *H01L 33/0093* (2020.05); *H01L 33/0095* (2013.01); *H01L 33/62* (2013.01)

(58) Field of Classification Search
CPC ................ H01L 25/0753; H01L 25/13; H01L 27/15–156; H01L 33/0093
See application file for complete search history.

(56) References Cited

U.S. PATENT DOCUMENTS

| 2009/0212305 A1 | 8/2009 | Harada |
| 2015/0111329 A1* | 4/2015 | Wu ..................... H01L 33/0095 438/28 |

(Continued)

FOREIGN PATENT DOCUMENTS

| CN | 105723528 A | 6/2016 |
| DE | 10 2009 010 265 A1 | 9/2009 |

(Continued)

*Primary Examiner* — Zandra V Smith
*Assistant Examiner* — Molly K Reida
(74) *Attorney, Agent, or Firm* — DLA Piper LLP (US)

(57) ABSTRACT

A method of producing an optoelectronic semiconductor component includes A) providing at least three source substrates, wherein each of the source substrates is equipped with a specific type of radiation-emitting semiconductor chips, B) providing a target substrate having a mounting plane configured to mount the semiconductor chips thereto, C) forming platforms on the target substrate, and D) transferring at least some of the semiconductor chips with a wafer-to-wafer process from the source substrates onto the target substrate so that the semiconductor chips transferred to the target substrate maintain their relative position with respect to one another, within the types of semiconductor (Continued)

chips, wherein on the target substrate the semiconductor chips of each type of semiconductor chips have a specific height above the mounting plane due to the platforms so that the semiconductor chips of different types of semiconductor chips have different heights.

18 Claims, 11 Drawing Sheets

(56) References Cited

U.S. PATENT DOCUMENTS

2016/0086927 A1    3/2016    Sasaoka et al.
2016/0104695 A1    4/2016    Yeh et al.

FOREIGN PATENT DOCUMENTS

| JP | 07-015044 A | 1/1995 |
| JP | 07-283438 A | 10/1995 |
| WO | 2012/008598 A1 | 1/2012 |

* cited by examiner

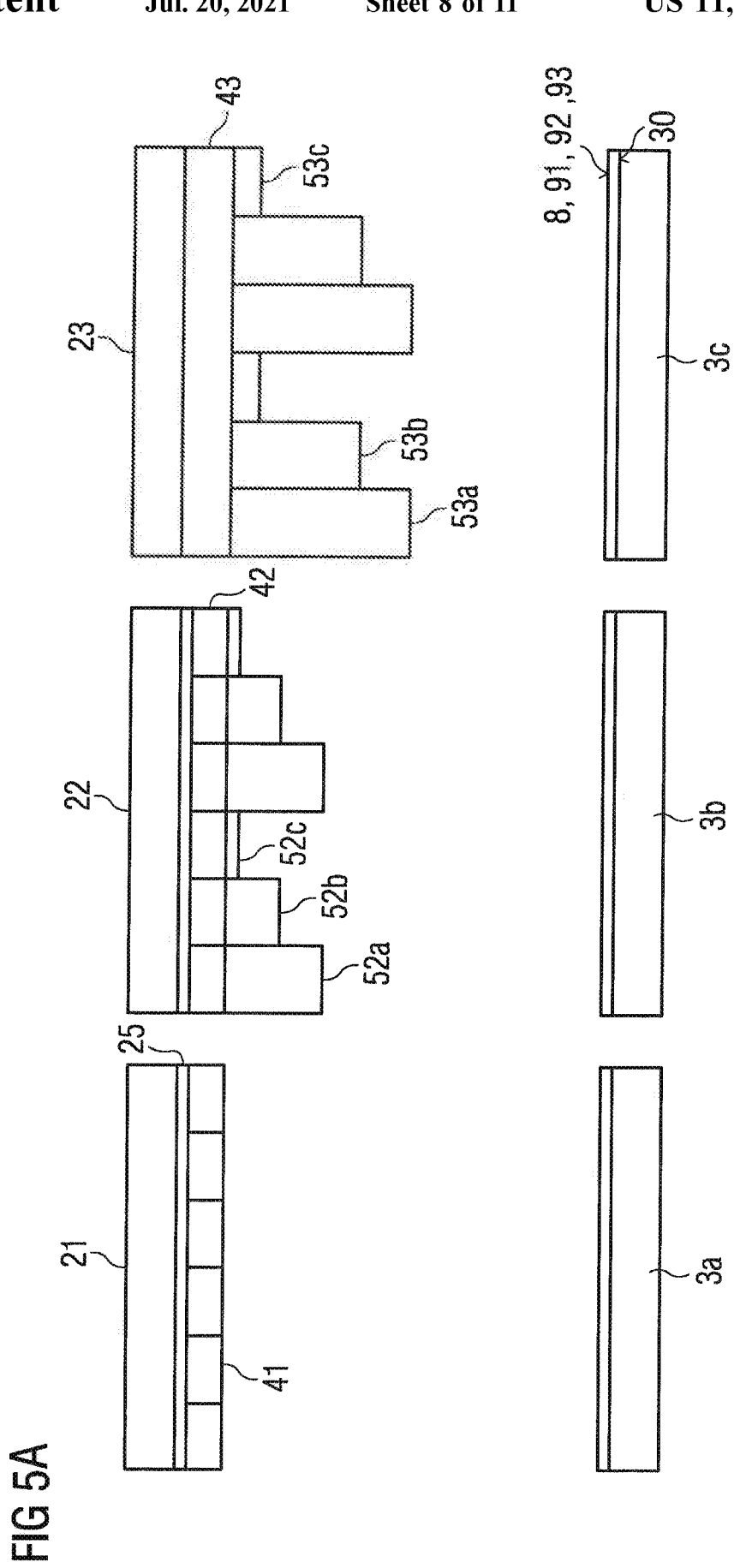

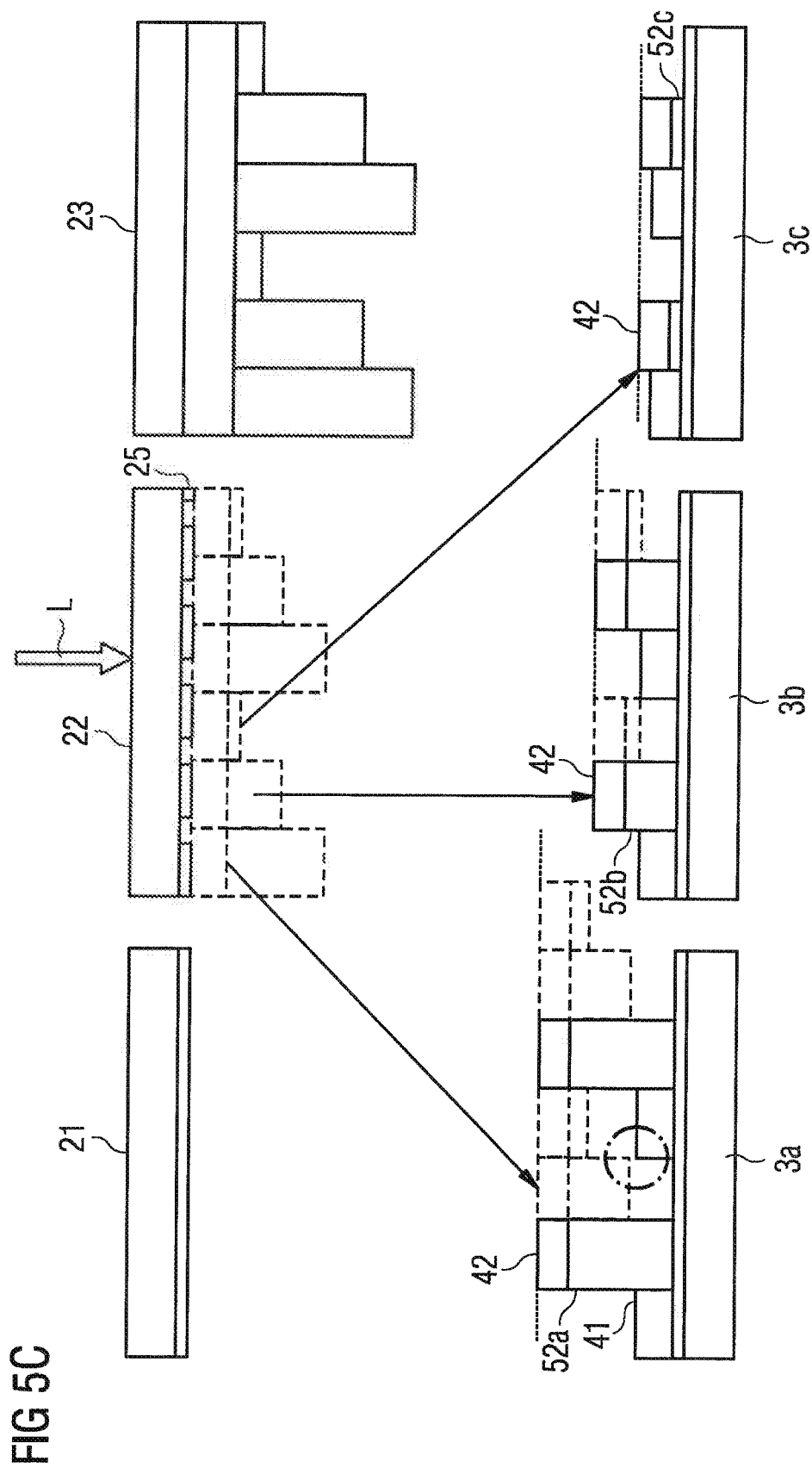

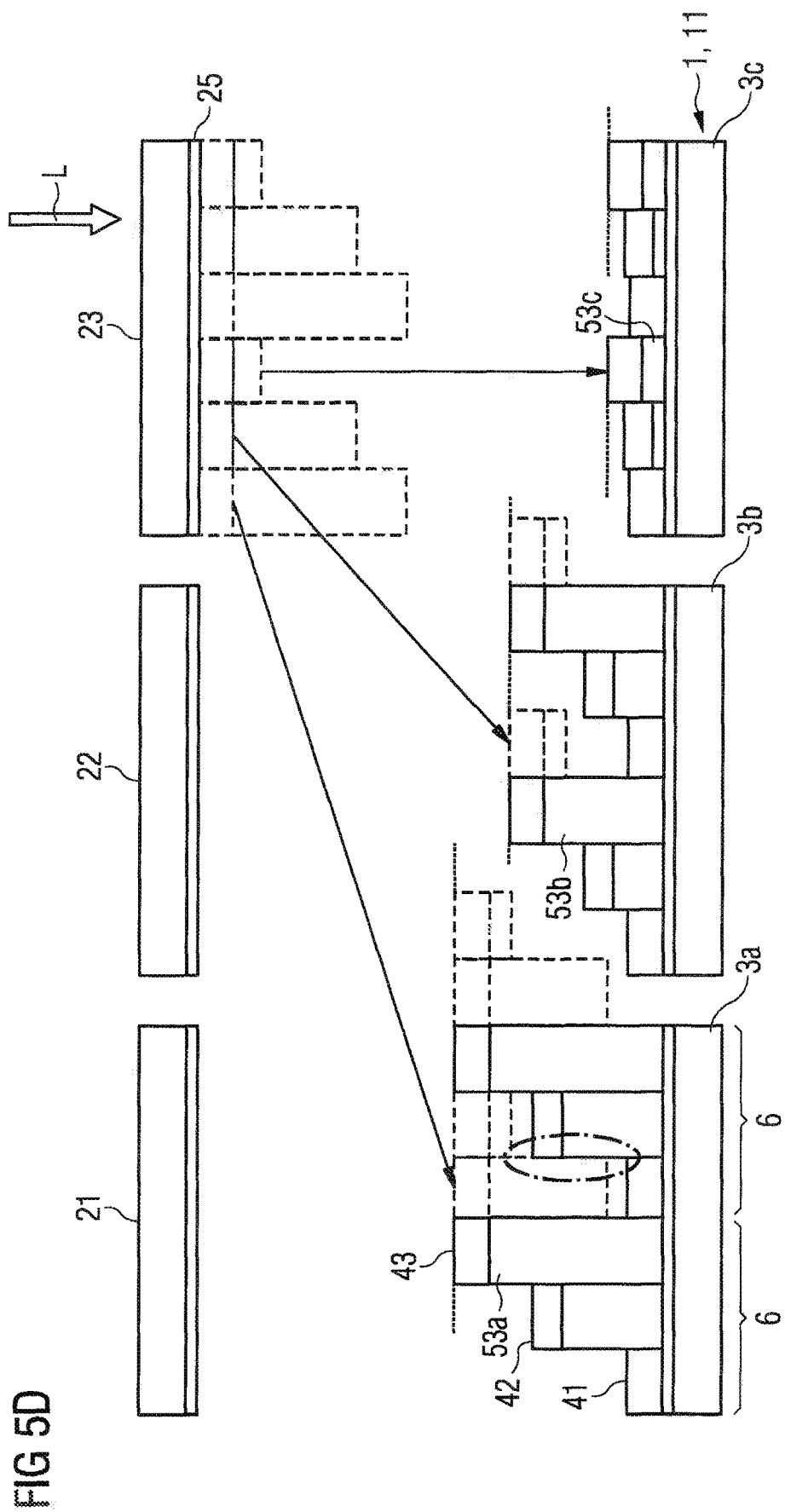

METHOD OF PRODUCING AN OPTOELECTRONIC SEMICONDUCTOR COMPONENT, AND OPTOELECTRONIC SEMICONDUCTOR COMPONENT

TECHNICAL FIELD

This disclosure relates to a method of producing an optoelectronic semiconductor component and an optoelectronic semiconductor component.

BACKGROUND

There is a need to provide a method with which a target substrate can be fitted efficiently with a plurality of types of semiconductor chips.

SUMMARY

We provide a method of producing an optoelectronic semiconductor component including A) providing at least three source substrates, wherein each of the source substrates is equipped with a specific type of radiation-emitting semiconductor chips, B) providing a target substrate having a mounting plane configured to mount the semiconductor chips thereto, C) forming platforms on the target substrate, and D) transferring at least some of the semiconductor chips with a wafer-to-wafer process from the source substrates onto the target substrate so that the semiconductor chips transferred to the target substrate maintain their relative position with respect to one another, within the types of semiconductor chips, wherein on the target substrate the semiconductor chips of each type of semiconductor chips have a specific height above the mounting plane due to the platforms so that the semiconductor chips of different types of semiconductor chips have different heights, only after the transfer of the semiconductor chips of a first to a penultimate type of semiconductor chips and before the semiconductor chips of the respective next type of semiconductor chips are transferred, one of each type of platform is produced, and at least the semiconductor chips of one of the types of semiconductor chips are detached from the respective source substrate by a laser lift-off method so that a laser radiation is irradiated through the associated source substrate.

We also provide an optoelectronic semiconductor component which is a display device or an image point, including a target substrate having a mounting plane, semiconductor chips of at least two types of radiation-emitting semiconductor chips on the target substrate, and at least one platform, wherein at least one of the types of semiconductor chips is mounted on the at least one platform so that the semiconductor chips of different types of semiconductor chips have a different height above the mounting plane due to the at least one platform.

BRIEF DESCRIPTION OF THE DRAWINGS

FIGS. 1A-M and 5A-D show schematic representations of method steps of examples of methods of producing optoelectronic semiconductor components.

Figure 1A:
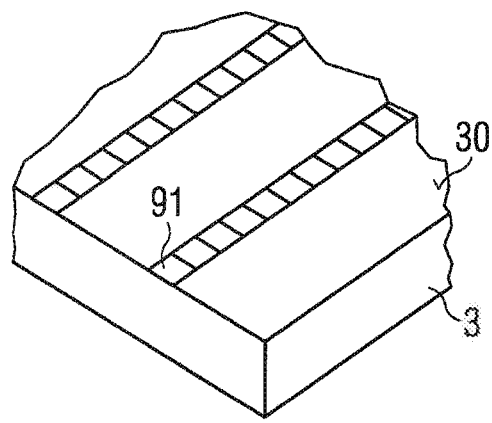

LIST OF REFERENCE SIGNS 1 display device
11 image point
21 first source substrate
22 second source substrate
23 third source substrate
25 sacrificial layer
3 target substrate
30 mounting plane
35 positioning mark
38 rear side
41 first semiconductor chip
42 second semiconductor chip
43 third semiconductor chip
52 platforms for the second semiconductor chips
53 platforms for the third semiconductor chips
6 stairway
61 line with the first semiconductor chips
62 line with the second semiconductor chips
63 line with the third semiconductor chips
7 planarization layer
71 potting
8 electric line
88 electrical connection surface
91 electrical contact area for the first semiconductor chips
92 contact area for the second semiconductor chips
93 contact area for the third semiconductor chips
H1 height of the first semiconductor chips above the mounting plane
H2 height of the second semiconductor chips above the mounting plane
H3 height of the third semiconductor chips above the mounting plane
L laser radiation

DETAILED DESCRIPTION

One or a plurality of optoelectronic semiconductor components may be produced using the method. The semiconductor components are, for example, display devices such as displays, in particular so-called RGB displays, or image points or units for image points for such displays. The individual pixels each have, for example, one semiconductor chip for red, green and blue light so that RGB image points are formed, for example. As an alternative, a plurality of semiconductor chips of a specific type can be present within an image point, for example, two green-emitting semiconductor chips for RGGB image points, or three blue-emitting semiconductor chips for RBBB image points, also in combination with one or different phosphors. The semiconductor components can also be pixel-based lamps, for example, for modulatable flash lights in which each or some of the pixels emits radiation of the same color, for example, warm white, or also pixels with different colors, in particular with different white tones such as warm white and cold white.

The method may comprise the step of providing at least two source substrates. Preferably, exactly three or exactly four source substrates are provided. Each of the source substrates is equipped with a specific type of radiation-emitting semiconductor chips, in particular with light-emitting diode chips. By way of example, a first source substrate has light-emitting diode chips designed identically and for the emission of blue light, a second source substrate has structurally identical light-emitting diode chips that generate red light and a third source substrate has structurally identical light-emitting diode chips that generate green light. Optionally, a fourth source substrate has structurally identical light-emitting diode chips that emit near-infrared radiation. In particular, the source substrates for the green and/or blue-emitting semiconductor chips can be growth substrates.

It is possible for the source substrates to be complete semiconductor discs or wafers or also that the source substrates are only disk segments or wafer segments, for example, with a size 3 cm×2 cm, that are transferred to the target substrate.

A target substrate may be provided. The target substrate has a mounting plane. The mounting plane is preferably planar and, as intended, is not or not significantly curved. In this example, a possible, production-related curvature of the target substrate, for instance by temporarily elevated temperatures and thermal stresses, preferably remains disregarded. The mounting plane is designed to mount the semiconductor chips thereon.

The method may comprise the step of generating platforms. The platforms are produced on the target substrate and/or on at least one of the source substrates. If the platforms are produced on the source substrates, all the source substrates are preferably provided with the platforms with the exception of a single source substrate. The platforms are provided to mount the semiconductor chips thereon.

At least some of the semiconductor chips are transferred from the source substrates to the target substrate. The transfer is a disc-to-disc process, also referred to as a wafer-to-wafer process. This means, in particular, that a multiplicity of semiconductor chips is transferred in the wafer composite. As a result, it is possible for the semiconductor chips transferred to the target substrate to retain their relative position with respect to one another within one type. In other words, on the target substrate the transferred semiconductor chips within one type are arranged relative to one another in exactly the same way as on the associated source substrate. During the transfer from the source substrate to the target substrate, no spatial reorientation or re-sorting takes place with regard to the transferred semiconductor chips.

This applies in particular to each transfer step. If, for example, n semiconductor chips of the same emission color are required for RGGB pixels per production pixel, n being a natural number, in particular n=2 or n=3, it is possible that all of these semiconductor chips are transferred from a single source substrate in a single transfer step. It is equally possible for n source substrates to be used, for example, for one line of these semiconductor chips each so that n transfer steps take place, or that a source substrate is used, from which the n transfer steps are carried out. Within each of the transfer steps, there is then no change in the relative positions to one another. If, for example, a plurality of transfer steps are carried out in particular from a single source substrate, the relative positions are changed between the transfer steps. This means that, relative to the source substrate, all semiconductor chips transferred in a first transfer step, remain positioned identically relative to one another, and also all semiconductor chips transferred in a second transfer step retain their relative positions. However, the positions of the semiconductor chips transferred in the first step change relative to the semiconductor chips transferred in the second transfer step.

On the target substrate each type of semiconductor chips may have a different height above the mounting plane on account of the platforms. All semiconductor chips of a specific type are thus arranged on the target substrate at the same level above the mounting plane. In this example, particularly preferably no two types of semiconductor chips are located at the same height. In other words, the heights for the types of semiconductor chips are each preferably different from one another in pairs. If a plurality of semiconductor chips of the same emission color are required per pixel and if these semiconductor chips are transferred in a plurality of transfer steps, thus, preferably exactly one height is present per transfer step. This means that the number of different heights is preferably equal to the number of transfer steps carried out. In a plurality of identically emitting semiconductor chips per finished image point, a plurality of different heights can thus be present per type of semiconductor chips. However, different types of semiconductor chips are particularly preferably always at different heights.

The method may be configured to produce optoelectronic semiconductor chips and comprise the following steps, preferably in the order specified:

A) providing at least two source substrates, wherein each of the source substrates is equipped with a specific type of radiation-emitting semiconductor chips, B) providing one or more target substrates each having a mounting plane, wherein the mounting plane is designed to mount the semiconductor chips thereto, C) producing platforms on the at least one target substrate and/or on at least one of the source substrates, and D) transferring at least a part of the semiconductor chips from the source substrates to the target substrate by a wafer-to-wafer process so that the semiconductor chips transferred to the target substrate retain their relative position with respect to one another within one type and in particular per transfer step, wherein on the target substrate each type of semiconductor chips has a different height above the mounting plane on account of the platforms.

A parallel loading of RGB modules can thus be carried out. The transferred light-active layers, that is the individual semiconductor chips, are addressed, for example, using a cross-matrix circuit or are installed as individual RGB units. In this example, the miniaturized RGB units are scalable. Sizes of the individual semiconductor chips are preferably at least 1×1 µm and/or at most 200 µm×200 µm.

In particular, a sequential stairway process of transferring the semiconductor chips is applied in the method. In a first step, a fully equipped LED wafer or a partially equipped LED wafer connects to a target substrate and to platforms of a first height, in particular in a line shape. The connected semiconductor chips are detached from the wafer and the remaining LED wafer is removed. Thereafter, second platforms are set up, for example, by photographic technology and electroplating. The second platforms can already be present in a pre-structured manner on the target substrate or on the source substrate, for instance as a thin metal layer, wherein in particular a galvanic reinforcement is carried out just after the semiconductor chips have been applied. Correspondingly, a second and optionally a further LED wafer with further colors connect to the target substrate, the corresponding semiconductor chips are transferred and the remaining LED wafers are removed. Between application of specific types of semiconductor chips, further platforms are preferably produced in particular galvanically. The platforms can be grown without current, for instance without phototechnology, if suitable seed layers are present, for instance, of palladium.

A precise thin film transfer, that is a transfer of semiconductor chips without growth substrate, can thus be realized. Depending on the wafer size used, $10^4$ to $10^7$ semiconductor chips can be transferred per process step. In this example, a low component height can be achieved since only one light-active, epitaxially grown semiconductor layer of the semiconductor chips is transferred to the target substrate without growth substrates.

Different electrical connection concepts can be realized in a simple manner by the specified method. Conventional machines can be used to electrically contact the semiconductor chips. There is only minimal thickness variation on the target substrate across the semiconductor chips. Particularly small tolerances, for example, smaller than 1 µm, can be realized in the mounting plane. An extremely precise bonding method can be applied on the wafer level.

Platforms may be dispensed with in one of the source substrates. In this example, a sequence A), B), D), C), D), C), . . . of the method steps is chosen so that, in other words, the first step C) is omitted. Alternatively, platforms are used for each of the source substrates so that a process sequence A), B), C), D), C), D), . . . of the method steps is used.

At least $10^4$ or $10^5$ or $10^6$ of the semiconductor chips may be transferred per type in step D). The number of semiconductor chips transferred per type is alternatively or additionally at most $10^8$ or $10^7$.

Precisely three types of semiconductor chips may be transferred. In this example, one type of semiconductor chips is configured to emit green light, one type for emission of red light and one type for emission of blue light. Within each one of the types, the semiconductor chips are identical in construction within the scope of the production tolerances. As a result, RGB image points can be generated in large numbers for a display device or for subsequent separation.

Alternatively, it is possible that not only visible light-emitting semiconductor chips, but also further semiconductor chips, for example, that generate near-infrared radiation, are installed.

n types of semiconductor chips may be transferred to the target substrate, wherein n is a natural number. After step D), either n or n−1 types of platforms are present on the target substrate. In particular, n=2 or n=3 or n=4.

The different types of semiconductor chips may each be arranged in lines. In this example, preferably a plurality of lines of semiconductor chips of one type are present. It is possible for only semiconductor chips of the same type to be mounted within one line. Alternatively, the lines are composed of semiconductor chips of a plurality of different types.

The lines with the types of semiconductor chips may be arranged periodically. A periodicity is preferably n, that is, the number of types of semiconductor chips. If, for example, three types of semiconductor chips are present, three different types of lines are preferably present. If a translation takes place by three lines in the direction perpendicular to the lines, the lines are preferably imaged in corresponding subsequent lines.

Each stairway may be formed, as viewed in cross section, by n consecutive lines. The stairway preferably has n or n−1 steps, in particular in relation to the mounting plane. The steps are realized, for example, by the platforms and optionally by electrical contact areas for the semiconductor chips.

All stairways may be identically oriented on the target substrate. This means that the stairways preferably run parallel to one another and incline in the same direction.

A distance between adjacent semiconductor chips within a stairway and/or within an image point may be smaller than a distance between adjacent stairways and/or between adjacent image points. This applies in a plan view of the mounting plane. Alternatively, the semiconductor chips can extend at a constant distance and in a regular grid across several or all stairways and/or image points.

The platforms may be produced on the target substrate. In this example, the source substrates are preferably free of platforms. The platforms are, for example, galvanically produced. Alternatively, it is possible for the platforms to be produced, for example, by a printing method such as screen printing or by photolithographically structured lacquers. Platforms on the source substrates can also be produced using these methods.

n or n−1 types of platforms may be produced on the target substrate. In this example, one type of platforms is preferably produced after the transfer of the first type to the n−1 type of semiconductor chips and prior to the transfer of the respective next type of semiconductor chips. In other words, the platforms belonging to the respective type of semiconductor chips are produced directly before the associated semiconductor chips are applied. This preferably applies to all types of semiconductor chips, wherein this does not need to apply to the initially applied type of semiconductor chips since the platforms are optional for the initially applied type of semiconductor chips.

The platforms may be produced on one or more of the source substrates. Particularly preferably, exactly one of the source substrates and/or the target substrate remains free of the platforms. If the platforms are produced on at least two source substrates, the platforms on the different source substrates can differ from one another.

Platforms having different heights may be produced for each source substrate. If two of the source substrates are provided with platforms, thus, preferably on one of the source substrates there are first, second and third heights of platforms and, on another source substrate, there are fourth, fifth and sixth heights of platforms. In this example, all the heights are preferably different from one another. The heights of the platforms on the source substrates behave in particular as follows, sorted from the largest to the smallest height: first height, fourth height, second height, fifth height, third height, sixth height.

The platforms may be produced on the at least one source substrate on a side of the associated semiconductor chips facing away from the corresponding source substrate. In other words, the semiconductor chips lie on the respective source substrate between the platforms and this source substrate.

In step D) only each of the semiconductor chips provided with the highest platforms need be transferred from the source substrate to the target substrate. In other words, the semiconductor chips can be transferred in different, successive method steps according to the heights of the platforms from the source substrate to the target substrate or to a plurality of target substrates.

In step D) only a part of the semiconductor chips originally present on the respective source substrate need be transferred to the target substrate. The number of originally present semiconductor chips relates in particular to the fully populated source substrate, before for the first time semiconductor chips are transferred to the target substrate, for instance directly after the semiconductor chips have grown. Based on the originally present number of semiconductor chips, preferably has a third or a sixth of the semiconductor chips of the source substrate is transferred to one target substrate in step D). This means that the corresponding source substrate can serve as a source substrate for a plurality of different target substrates. For example, a third of the originally present semiconductor chips are transferred line-by-line to three different target substrates from one source substrate. The same applies to another portion of the semiconductor chips transferred in step D).

At least one of the source substrates may be a growth substrate for the associated semiconductor chips. Alternatively, it is possible for the source substrate to be a replacement carrier for a growth substrate. This applies in particular to red or infrared-emitting semiconductor chips. The replacement substrate in the form of the source substrate is applied to a side of the corresponding semiconductor layer sequence facing away from the growth substrate, whereupon the growth substrate is removed. During transfer from the growth substrate to the replacement substrate, in particular to the corresponding source substrate, relative positions of the semiconductor chips relative to one another do not change.

The semiconductor chips may be electrically contacted with the platforms. The platforms are preferably made of an electrically conductive material such as a metal or a metal alloy.

The semiconductor chips may be electrically controllable individually and independently of one another. Thus, image points can be built up that emit light of different colors as a function of time.

A unique assignment may exist between semiconductor chips mounted on platforms and the corresponding platforms. In other words, these semiconductor chips and the platforms are assigned to one another in a one-to-one manner. In particular, precisely one of the semiconductor chips is mounted on each of the platforms.

Step D) may be followed by a step E). In step E), a planarization layer that is preferably light-transmissive is produced. The planarization layer terminates, for example, flush with light exit sides of semiconductor chips furthest away from the mounting plane.

Electrical lines for electrically contacting the semiconductor chips may be produced on the planarization layer. In this example, it is possible for a plurality of successive planarization layers to be present to electrically contact the semiconductor chips in a plurality of planes. Alternatively or additionally, electrical vias, also referred to as through-connections, can be present through the planarization layer and/or through the target substrate.

Step D), in particular also step E), may be followed by a step F). In step F) the target substrate is singulated. Individual image points can be formed by the singulation. It is likewise possible that one or more display devices having a plurality of image points are formed by the singulation and by an optional cutting.

The platforms may be constructed from a metal or a metal alloy or from a plurality of metal partial layers. In other words, the platforms are metallic platforms. Alternatively, the platforms can be made of a plastic or of a lacquer structured by a phototechnique. Furthermore, the platforms can be made of a transparent conductive oxide, TCO for short, or of a ceramic or of a semiconductor material. Furthermore, composite materials are possible. The platforms can be grown on the target substrate and/or on the source substrate or alternatively can be mounted line-by-line or individually as separately produced bodies by loading on the source substrate and/or the target substrate.

We further provide an optoelectronic semiconductor component. The semiconductor component is preferably produced using a method as described in connection with one or more of the above-mentioned examples. Features of the method are therefore also disclosed for the optoelectronic semiconductor component and vice versa.

The optoelectronic semiconductor component may be a display device or an image point for a display device. The semiconductor component comprises a target substrate having a mounting plane and at least two types of radiation-emitting semiconductor chips on the target substrate. Furthermore, at least one platform, preferably a plurality of platforms, is present. At least one type of semiconductor chips is mounted on the at least one platform so that each type of semiconductor chips has a different height above the mounting plane on account of the platforms.

The semiconductor component may be an image point. Such an image point can also be referred to as a pixel or color triple unit. In particular, the image point is an RGB unit having exactly three different types of semiconductor chips and/or with exactly three or exactly four semiconductor chips. The platforms are preferably made of a metal or a metal alloy or of a plurality of metal partial layers.

The target substrate may be a permanent carrier. The target substrate is, for example, a metallic carrier, a ceramic carrier, a glass carrier or a semiconductor carrier. The target substrate is preferably free of plastics and/or organic materials.

The semiconductor component may be a display device for displaying colored films and/or images. The display device preferably has at least $10^4$ or $10^5$ or $10^6$ and/or at most $10^8$ or $10^7$ or $10^6$ of the semiconductor chips.

A positioning tolerance across all semiconductor chips of one type and across the target substrate may at most be 10 µm or 5 µm or 1 µm. The positioning tolerance substantially corresponds to a tolerance for a phototechnique when producing the semiconductor chips on a growth substrate. This comparatively small positioning tolerance can be determined by the disk-to-wafer process during the transfer of the semiconductor chips from the source substrate, which is in particular a growth substrate, onto the target substrate. In this example, an average diameter of a region, over which the semiconductor chips are distributed and over which the positioning tolerance is maintained, is at least 2 cm or 5 cm or 10 cm and/or at most 30 cm or 15 cm or 5 cm.

Our methods and optoelectronic semiconductor components are explained in more detail below with reference to the drawings on the basis of examples. Identical reference signs indicate the same elements in the individual figures. However, no relationships to scale are illustrated. Rather, individual elements can be represented with an exaggerated size to afford a better understanding.

Figure 1B:
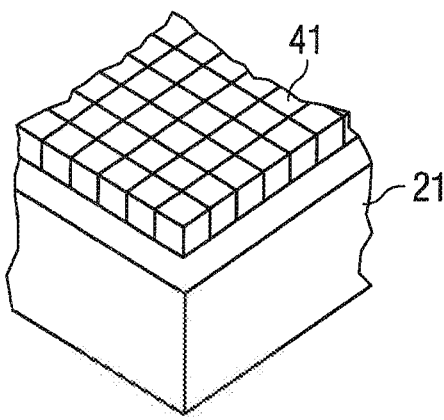
Figure 1C:
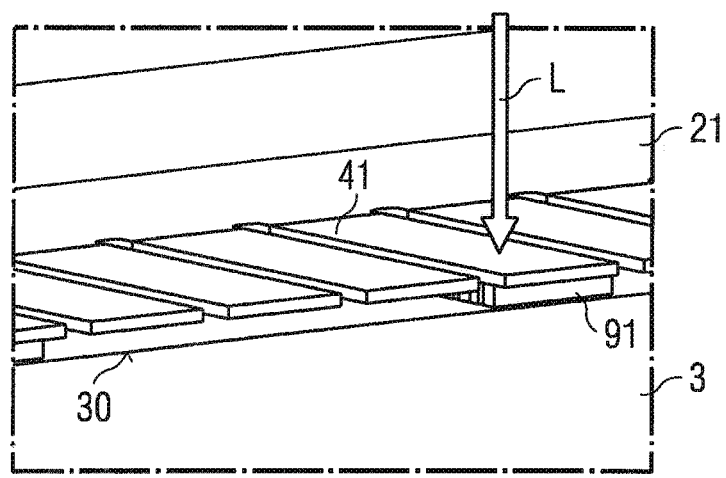
Figure 1D:
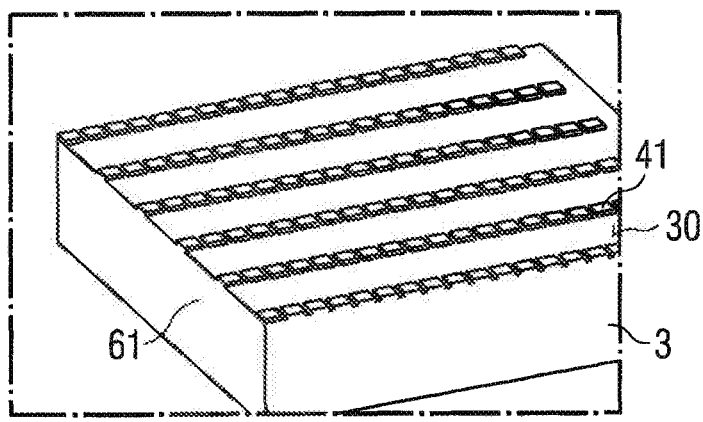
Figure 1E:
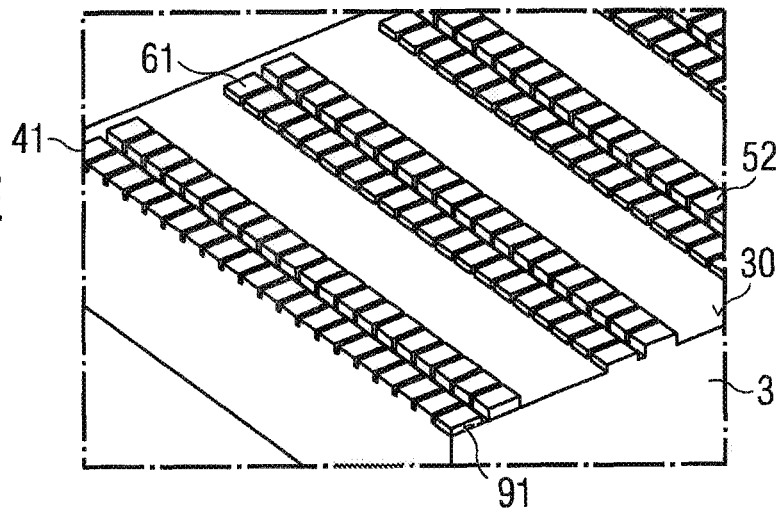
Figure 1F:
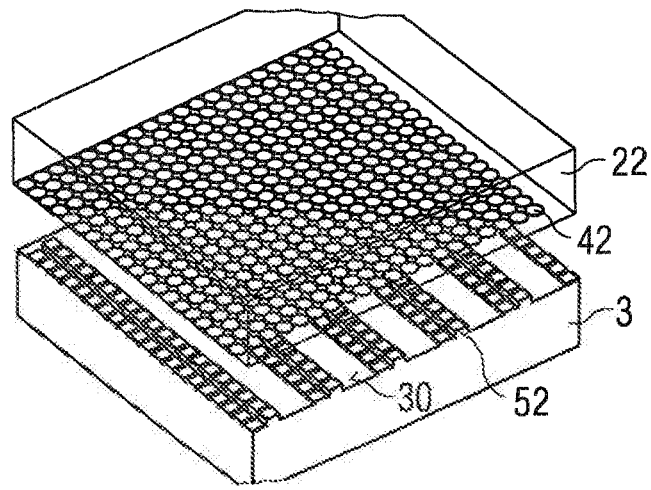
Figure 1G:
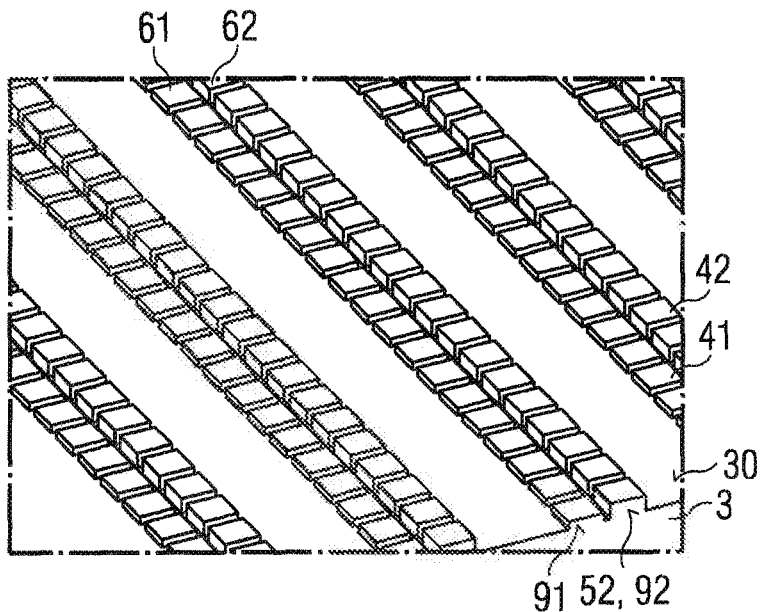
Figure 1H:
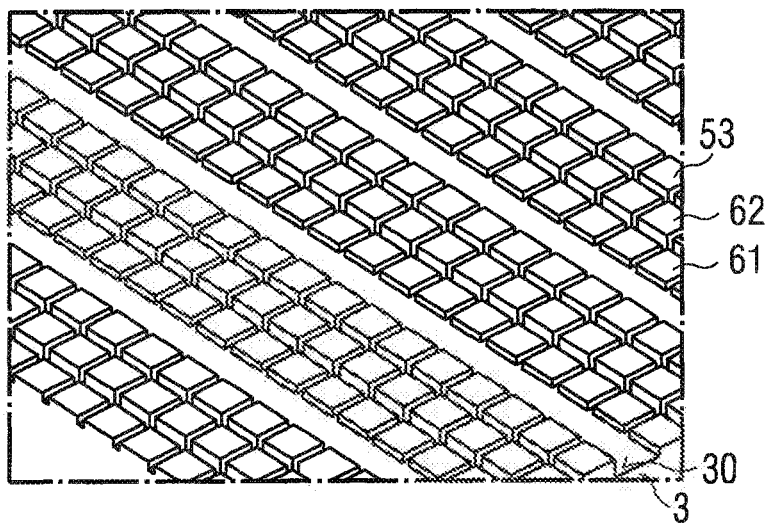
Figure 1I:
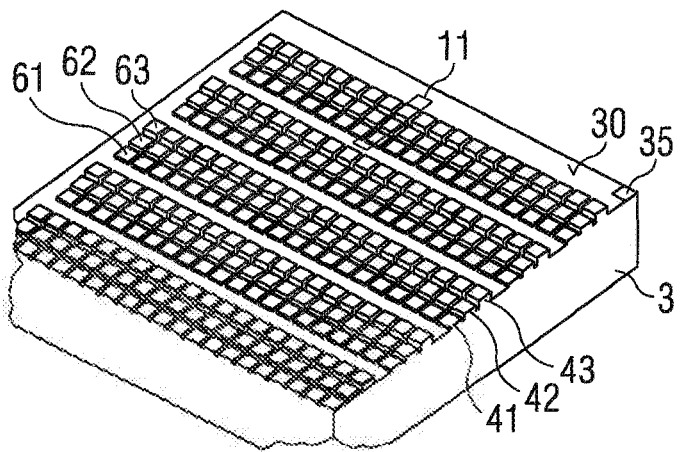
Figure 1J:
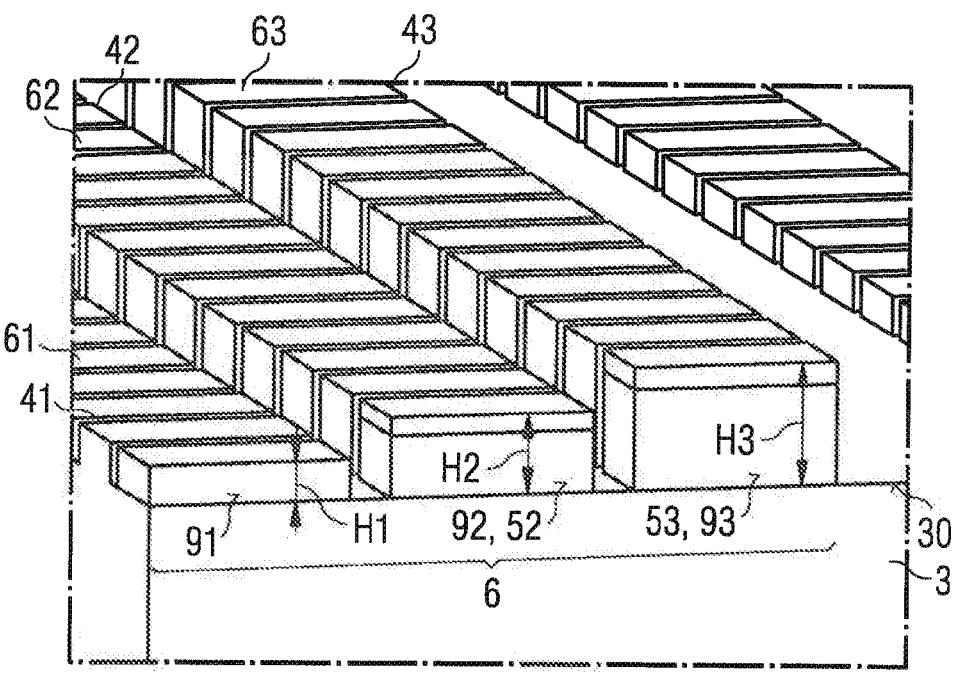
Figure 1K:
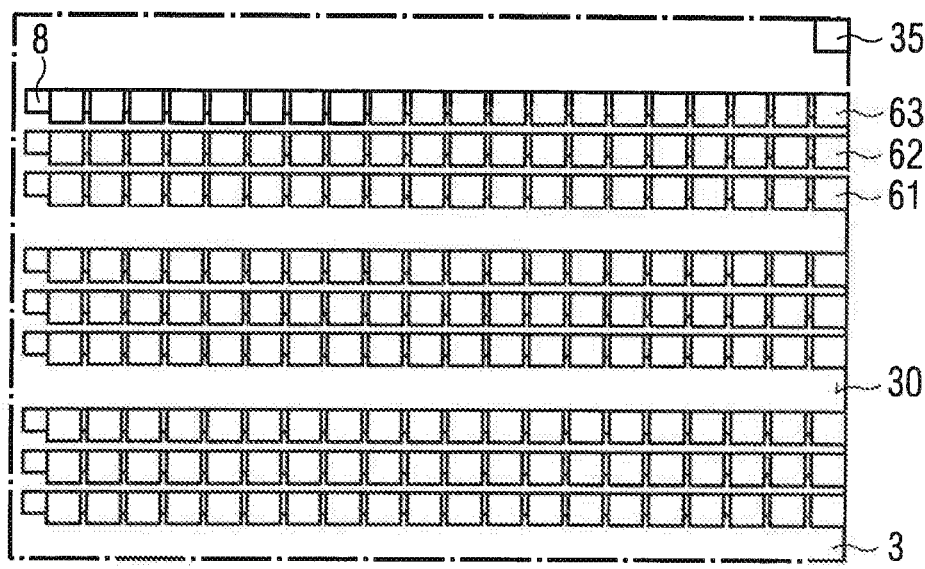

FIG. 1 shows an example of a method of producing an optoelectronic semiconductor component 1, 11 as shown in the perspective representations of FIGS. 1A to 1J, 1L and 1M and the top view in FIG. 1K.

According to FIG. 1A, a target substrate 3 having a mounting plane 30 is provided. The target substrate 3 is, for example, a ceramic substrate or a semiconductor substrate such as a silicon substrate that can contain electrical structures for driving and/or conductor tracks. Electrical contact areas 91 are located on the mounting plane 30. The contact areas 91 are formed, for example, by one or more metallizations and are preferably configured for soldering or electrically conductive adhesive bonding.

In the method step of FIG. 1B, a first source substrate 21 is provided. The first source substrate 21 has first semiconductor chips 41 densely packed or approximately densely packed on a main side. The first semiconductor chips 41 are preferably light-emitting diode chips that generate blue light. The first semiconductor chips 41 have in particular a semiconductor layer sequence based on the material system AlInGaN. The first source substrate 21 is preferably a growth substrate for the first semiconductor chips 41. For example, the first source substrate 21 is a sapphire substrate.

FIG. 1C shows how the first semiconductor chips 41 are applied to the contact areas 91. For this purpose, the first source substrate 21 and the target substrate 3 are brought together so that the first semiconductor chips 41 face the mounting plane 30. A specific portion of the first semiconductor chips 41 is arranged above the associated contact areas 91. The first semiconductor chips 41 electrically and mechanically fixedly connect to the associated contact areas 91 via soldering or electrically conductive adhesive bonding.

Subsequently, the first semiconductor chips 41 are detached from the first source substrate 21. This detachment is, for example, a laser lift-off method with a laser radiation L through the first source substrate 21.

Thus, as shown in FIG. 1D, lines 61 with the first semiconductor chips 41 remain on the mounting plane 30. The first source substrate 21 comprising the remaining, non-transferred first semiconductor chips 41 is removed.

In this way, a line of the first semiconductor chips 41 is absent from the first source substrate 21 after this method step, and the remaining first semiconductor chips 41 can be arranged in a method step corresponding to the step of FIG. 1C, onto a further target substrate (not shown), for example, line-by-line.

In the step of FIG. 1E, a plurality of platforms 52 are produced on the mounting plane 30. The platforms 52 are located line-by-line directly at the lines 61 with the first semiconductor chips 41. For example, the platforms 52 are galvanically produced. In this example, electrically conductive and in particular metallic surfaces (not shown) at the mounting plane 30 can be present as starting surfaces. Such starting surfaces correspond, for example, to the contact areas 91 for the first semiconductor chips 41.

According to FIG. 1F, a second source substrate 22 having second semiconductor chips 42 is provided. The second semiconductor chips 42 are, for example, red-emitting light-emitting diode chips. The second source substrate 22 is in particular a replacement carrier for a growth substrate of the second semiconductor chips 42.

The second semiconductor chips 42 are, for example, soldered or electrically conductively glued to the platforms 52, analogously to FIG. 1C. Once again analogously to FIG. 1C, these second semiconductor chips 42 are detached from the second source substrate 22, for instance by laser radiation (not shown).

Subsequently, the correspondingly transferred second semiconductor chips 42 remain on the platforms 52 that simultaneously form electrical contact areas 92 for the second semiconductor chips 42 as shown in FIG. 1G. Thus, after this second transfer step of second semiconductor chips 42 to the mounting plane 30, there are two lines 61, 62 of semiconductor chips 41, 42 emitting different colors on the target substrate 3.

According to FIG. 1H, further platforms 53 are produced. The further platforms 53 are located directly at the lines 61, 62. Then (not shown) follows a transferring of third semiconductor chips 43 from a third source substrate to the further platforms 53, analogously to the representation in FIGS. 1C and 1F.

This results in an arrangement of three lines 61, 62, 63 of first semiconductor chips 41, second semiconductor chips 42 and third semiconductor chips 43 on the mounting plane 30 as illustrated in FIG. 1I. The last transferred third semiconductor chips 43 are preferably green-emitting thin-film light-emitting diode chips transferred in particular directly from a growth substrate to the target substrate 3. The semiconductor chips 41, 42, 43 are electrically preferably combined into groups of three so that individual image points 11 result.

As in all other examples, it is also possible for the target substrate 3, in particular on the mounting plane 30, to have one or more positioning marks 35. By such positioning marks 35, the target substrate 3 and the source substrates 21, 22 can be positioned exactly one above the other.

A section from FIG. 1I is shown in FIG. 1J. The contact areas 91 and the platforms 52, 53 that likewise form contact areas 92, 93 constitute a stairway 6, viewed in cross section. Thus, three lines 61, 62, 63 are combined to form one stairway 6, seen in cross section. All stairways 6 as shown in FIG. 1I are oriented identically to one another and shaped identically. Within a stairway, the semiconductor chips 41, 42, 43 can be arranged with a smaller distance from one another than adjacent stairways 6 with respect to one another as shown in FIG. 1I.

The semiconductor chips 41, 42, 43 have different heights H1, H2, H3 above the mounting plane 30. The heights H1, H2, H3 relate to a side of the semiconductor chips 41, 42, 43 facing away from the mounting plane 30. The platforms 52 for the second semiconductor chips 42 are higher than the height H1 of the first semiconductor chips 41. Accordingly, the height H2 of the second semiconductor chips 42 is smaller than a height of the further platforms 53 for the third semiconductor chips 43. A height difference between the platforms 52 and the height H1 and between the further platforms 53 and the height H2 is preferably at least 1 μm or 5 μm and/or at most 20 μm or 10 μm. The same applies to all other examples.

The contact areas 91 and the platforms 52, 53 are uniquely assigned to the associated semiconductor chips 41, 42, 43. Viewed in a plan view, the sizes of the contact areas 91 and of platforms 52, 53 deviate from the base areas of the associated semiconductor chips 41, 42, 43 preferably by at most 50% or 25% or 10% or 5%. Alternatively or additionally, this deviation amounts at most to the thickness of a semiconductor layer sequence of the associated semiconductor chips 41, 42, 43.

A thickness of the semiconductor chips is, as in all other examples, preferably at least 2 μm or 3 μm and/or at most 8 μm or 6 μm. The different types of semiconductor chips 41, 42, 43 can have different thicknesses. A height of the steps of the stairways 6 is, for example, at least 1 μm or 4 μm and/or at most 20 μm or 10 μm. The more transfer steps are required per source substrate, the higher the associated platforms 52, 53, and the more types of platforms of different heights can be present.

In the method shown in FIG. 1, the pixels 11 each have one semiconductor chip 41, 42, 43 per emission color. In the same way, a plurality of semiconductor chips 41, 42, 43 can be present per emission color, for example, two green-emitting semiconductor chips 43 for RGGB image points. It is then possible for the two semiconductor chips 43 to lie per image point 11 on differently high platforms and that the transfer step of the FIGS. 1H and 1I is repeated accordingly so that a stairway 6 with four lines then results. In such or similar image points 11 that go beyond an RGB arrangement having three semiconductor chips 41, 42, 43, different heights can be present within one type of semiconductor chips, wherein precisely one height and/or one line and/or one step of the stairway is used for each transfer step so that the semiconductor chips 41, 42, 43 of different types are located at different heights. Thus, as is preferred also in all other examples, a number of different heights is equal to the number of semiconductor chips 41, 42, 43 per finished image point 11.

FIG. 1K illustrates that electrical lines 8 are present for the lines 61, 62, 63. Thus, line contacts can be constructed, for example, for a cross-matrix circuit of display devices 1, being video screens.

Figure 1L:
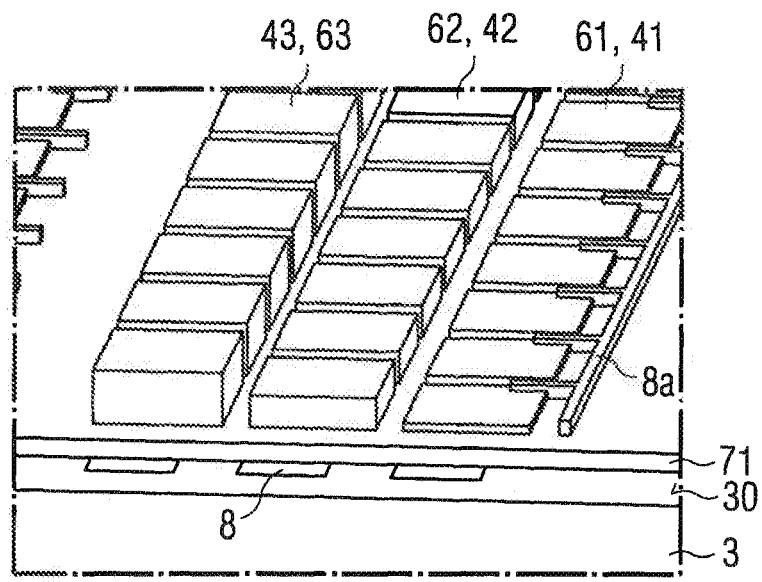

According to FIG. 1L, a potting 71 is attached and extends to a side of the first semiconductor chips 41 facing away from the mounting plane 30. Electrical lines 8a for the first semiconductor chips 41 are applied to this potting 71 that can be configured to be diffusely reflective. The side of the first semiconductor chips 41 facing away from the mounting plane 30 is electrically contacted via these lines 8a.

Figure 1M:
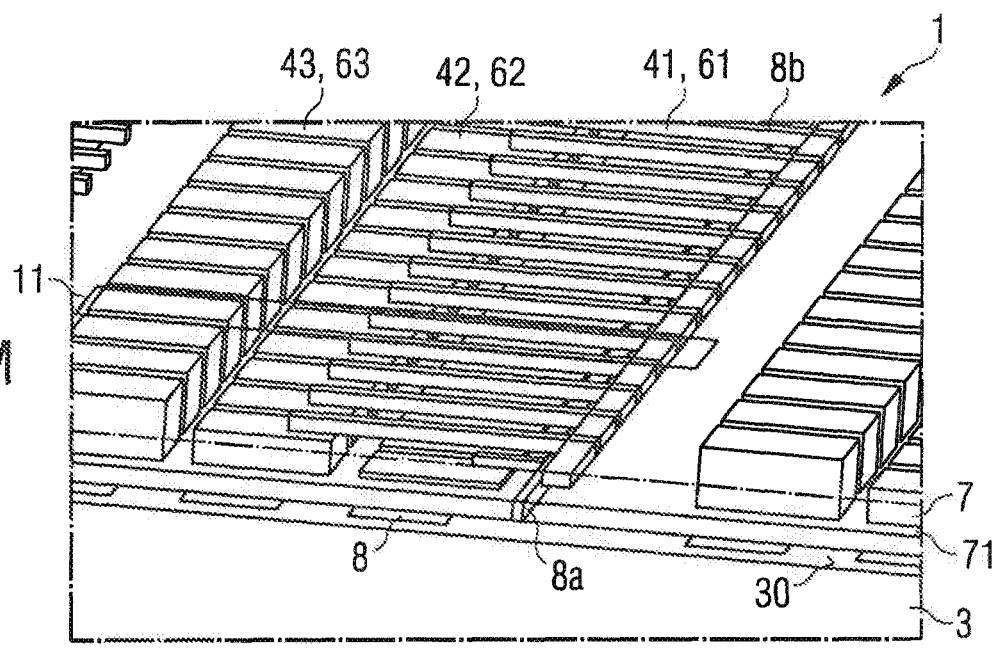

Accordingly, as shown in FIG. 1M, a planarization layer 7 is produced, which is preferably light-transmissive and extends to a side of the second semiconductor chips 42 facing away from the mounting plane 30. Electrical lines 8b for contacting the second semiconductor chips 42 are produced on this planarization layer 7, analogously to the lines 8a.

In the same way, further electrical lines, not illustrated, for the third semiconductor chips 43 are produced. Thus, in the display device 1, semiconductor chips 41, 42, 43, which can be controlled electrically independently of one another, result for individual image points 11.

Figure 2A:
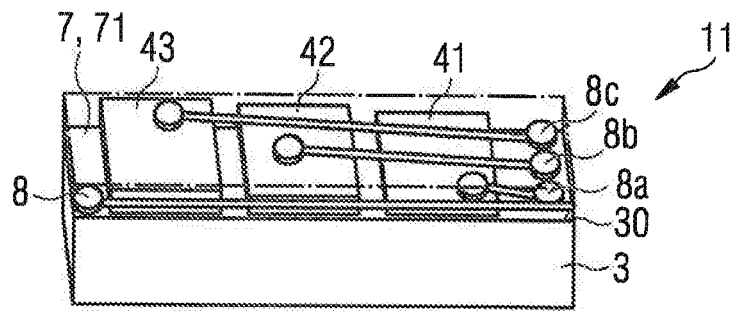
FIGS. 2A-D, 3 and 4 show schematic illustrations of examples of optoelectronic semiconductor components.

In addition to the method illustrated in FIG. 1, a singulation step can be carried out. The target substrate 3 is subdivided as desired with the singulation so that, for example, a plurality of display devices 1 having a plurality of image points 11 result. Likewise, many individual color triple units for precisely one image point 11 can be produced out of the target substrate 3 as shown in the perspective representation in FIG. 2A.

Figure 2B:
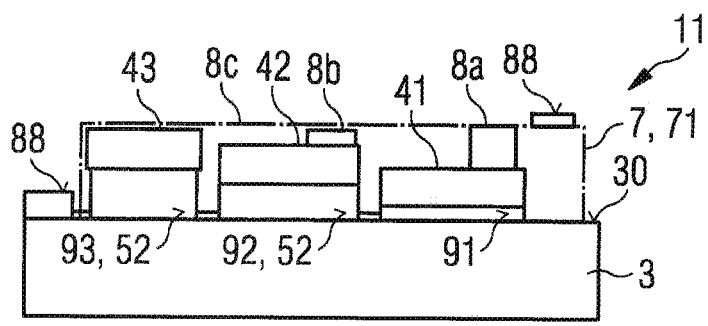
Figure 2C:
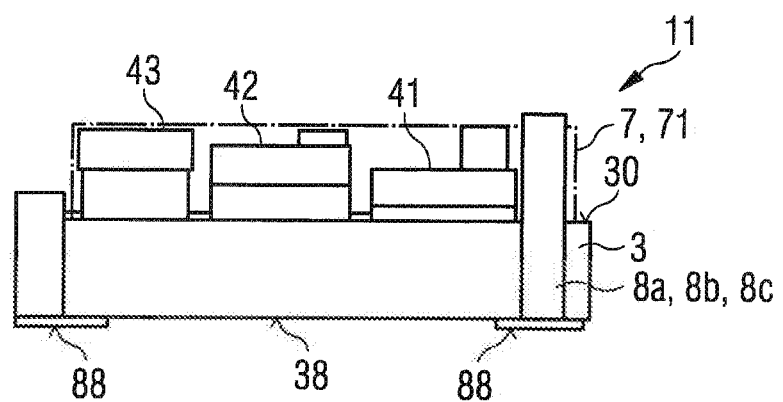

Possible electrical contactings for such image points 11 are illustrated by way of example in the sectional representations of FIGS. 2B and 2C. According to FIG. 2B, contacting takes place in planar fashion over the planarization layer 7. Electrical connection surfaces 88 are located on the same side of the mounting plane 30 as the semiconductor chips 41, 42, 43.

In contrast, the connection surfaces 88 in FIG. 2C lie on a rear side 38 of the target substrate 3 and thus on a different side than the semiconductor chips 41, 42, 43.

Figure 2D:
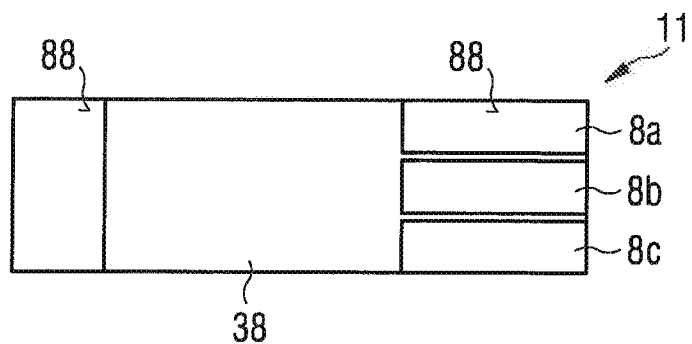

The rear side 38 is illustrated in FIG. 2D. For example, a connection surface 88 for the common conductor track 8 is present and in each example an additional connecting surface 88 for the electrical lines 8a, 8b, 8c. In contrast to the representation of FIGS. 2B to 2D, other configurations of electrical connection surfaces 88 can be present on the rear side 38 or on the mounting plane 30.

Figure 3:
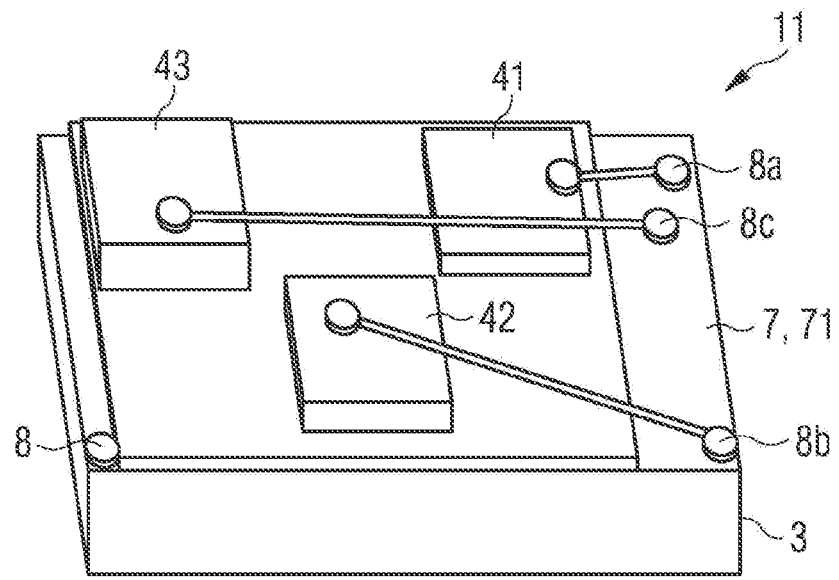

A further example of an image point 11 is illustrated in the perspective representation of FIG. 3. In this example, the semiconductor chips 41, 42, 43 are located not in a straight line perpendicular to the lines 61, 62, 63, for example, from FIG. 1K, but the semiconductor chips 41, 42, 43 are arranged offset with respect to one another. This is achieved, for example, in that only every second semiconductor chip 41, 42, 43 is transferred, other than shown in conjunction with FIG. 1C or 1F.

Figure 4:
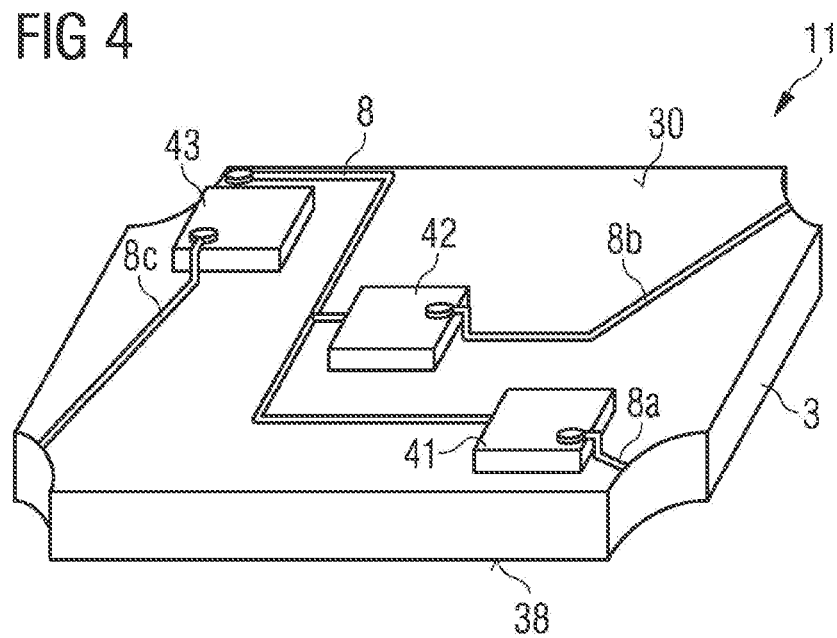

Another example is shown in FIG. 4. It is possible, as in all other examples, that the electrical lines 8a, 8b, 8c are guided via side faces of the semiconductor chips 41, 42, 43 onto the mounting plane 30. Connection surfaces of the image point 11 can be located on the mounting plane 30 or, preferably, on the rear side 38.

To guide the lines 8, 8a, 8b, 8c from the mounting plane 30 to the rear side 38, there are, for example, quarter-circular recesses at the corners or semicircular recesses on the side faces, the recesses can be metallized and can lead to the rear side 38. The same is possible in all other examples, too.

Distances between the semiconductor chips 41, 42, 43 to each other along the lines 61, 62, 63, cf. FIG. 1K, thus correspond in each example to a multiple of the distances of the semiconductor chips 41, 42, 43 to each other on the source substrates 21, 22. The distances between the lines 61, 62, 63, however, and thus between the colors can be freely set. As shown in connection with FIGS. 2 to 4, an arrangement geometry of the semiconductor chips 41, 42, 43 can be modified. Thus, for example, from each line of semiconductor chips 41, 42, 43 on the source substrates 21, 22, only every second or every third semiconductor chip 41, 42, 43 is transferred. As a result, the display device 1 and also the image points 11 are scalable.

As in all other examples, the target substrate is, for example, a glass substrate, a ceramic substrate such as aluminum oxide or aluminum nitride, a silicon substrate, for example, with electrical through-connections or with integrated electrical circuits, or a plastic substrate. It is also possible to use a composite substrate made of a plurality of different materials.

FIG. 5 illustrates a further example of the production method. In this example, the platforms 52, 53 are not formed successively on the target substrate 3, but are produced on the source substrates 22, 23. Thus, it is not necessary that, after each transfer step to the target substrate, a further step of a stairway have to be formed by the platforms 52, 53. All necessary platforms 52, 53 are already located on the source substrates 22, 23.

The semiconductor chips 41, 42, 43 preferably connect to the associated source substrate 21, 22, 23 via a sacrificial layer 25. The platforms 52, 53 can be differently thick metallizations, for instance galvanically produced and/or by a phototechnique. On the target substrates 3a, 3b, 3c and/or on the source substrates 21, 22, 23 there is each preferably a connecting material, for example, a solder, to which the semiconductor chips 41, 42, 43 can be attached.

The initial configuration of the source substrates 21, 22, 23 and of the target substrates 3a, 3b, 3c is illustrated in FIG. 5A. The first semiconductor chips 41 are located on the first source substrate 21 in a common plane, without platforms. The second and third semiconductor chips 42, 43 are located on the source substrates 22, 23 that are each provided with platforms 52a, 52b, 52c, 53a, 53b, 53c of different heights.

Figure 5B:
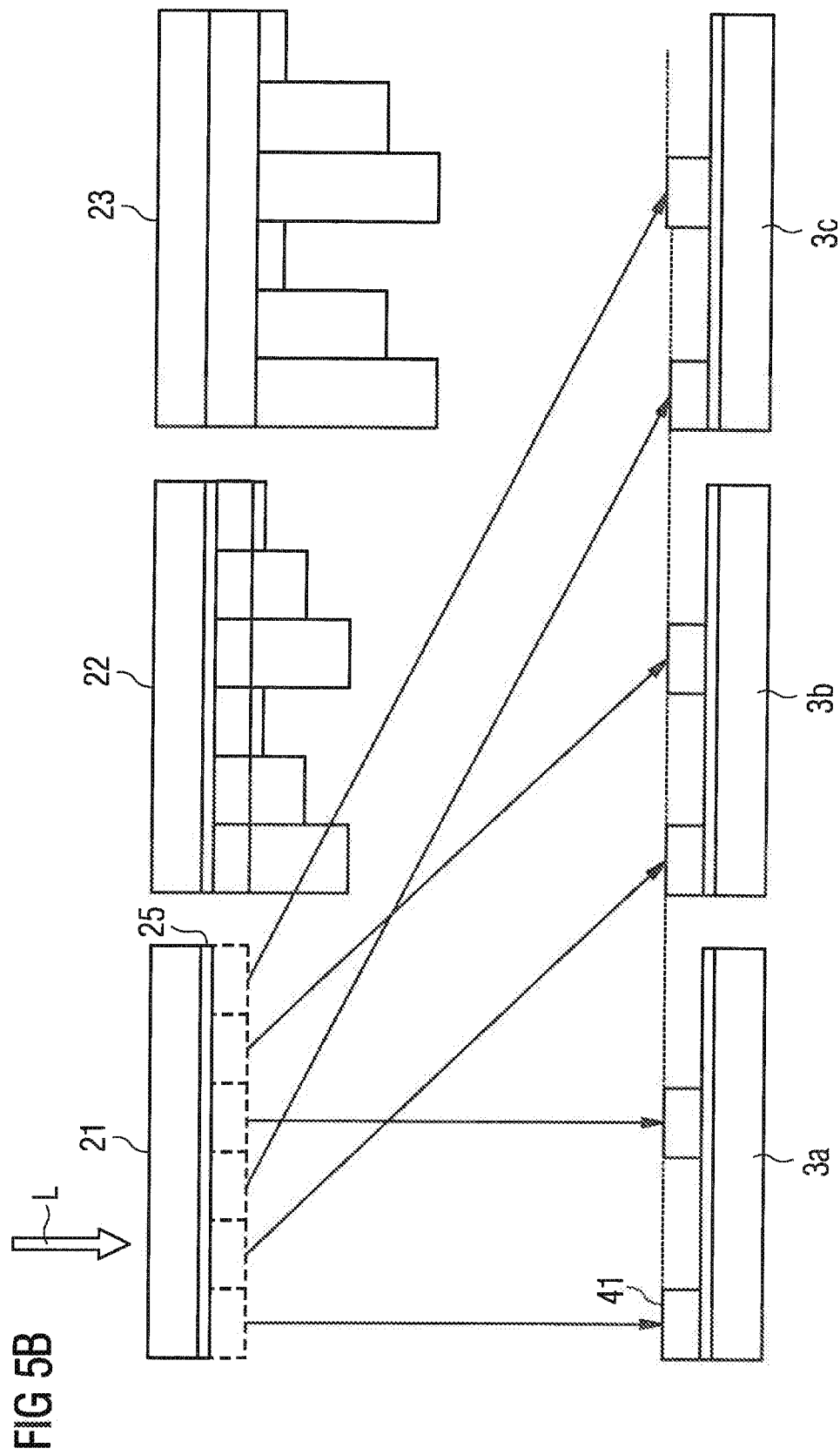

In a first method step as shown in FIG. 5B, the first semiconductor chips 41 are transferred to the target substrates 3a, 3b, 3c are in a line-shaped or matrix-like manner. The positions of the semiconductor chips not to be transferred and of the semiconductor chips released from the source substrate are symbolized by dashed lines in FIGS. 5B to 5D.

The second semiconductor chips 42 are subsequently transferred as shown in FIG. 5C. In this example, the semiconductor chips 42 are transferred to the target substrate 3a by the platforms 52a. Correspondingly, the semiconductor chips 42 with the platforms 52b are transferred onto the target substrate 3b and the semiconductor chips 43 with the platforms 52c are transferred onto the target substrate 3c. In other words, the semiconductor chips 42 are transferred the target substrates 3a, 3b, 3c in the sequence of the heights of the platforms 52a, 52b, 52c.

With a circle it is marked at the target substrate 3a that the platforms 52b (symbolized as dashed lines) have a height difference with respect to the platforms 52a. The height difference is preferably greater than the height of the first semiconductor chips 41. The same applies with regard to the platforms 52c and 52b. As a result, during application to the target substrates 3a, 3b it can be avoided that the platforms 52b, 52c touch the first semiconductor chips 41.

In the same manner as shown in FIG. 5D, the third semiconductor chips 43 are transferred to the target substrates 3a, 3b, 3c.

To prevent threading and touching the target substrate 3a, in the region marked in FIG. 5D a distance between adjacent stairways 6 can be selected to be larger than between adjacent semiconductor chips 41, 42, 43 within one of the stairways 6. To prevent touching in the marked region, it is alternatively or additionally possible that the platforms have a smaller width than the associated semiconductor chips 41, 42, 43.

In addition to a one-dimensional step arrangement as illustrated in FIG. 5, two-dimensional arrangements can also be used. If gaps remain between the semiconductor chips 41, 42, 43 within a line on the target substrates 3a, 3b, 3c after the transfer, thus, for example, not every third, but only every fourth or fifth or sixth semiconductor chip is transferred in a corresponding number of transfer steps to a correspondingly higher number of target substrates. The same also applies to all other examples.

The components shown in the figures follow, unless indicated otherwise, preferably in the specified sequence directly one on top of the other. Layers which are not in contact in the figures are spaced apart from one another. If lines are drawn parallel to one another, the corresponding surfaces are likewise oriented parallel to one another. Likewise, unless indicated otherwise, the relative thickness ratios, length ratios and positions of the drawn components relative to one another are correctly reproduced in the figures.

Our components and methods are not restricted by the description on the basis of the examples. Rather, this disclosure encompasses any new feature and also any combination of features that includes in particular any combination of features in the appended claims, even if the feature or combination itself is not explicitly specified in the claims or examples.

This application claims priority of DE 10 2017 100 812.8, the subject matter of which is incorporated herein by reference.

The invention claimed is:

1. A method of producing an optoelectronic semiconductor component comprising:
   A) providing at least three source substrates, wherein each of the source substrates is equipped with a specific type of radiation-emitting semiconductor chips,
   B) providing a target substrate having a mounting plane configured to mount the semiconductor chips thereto,
   C) forming platforms on the target substrate, and
   D) transferring at least some of the semiconductor chips with a wafer-to-wafer process from the source substrates onto the target substrate so that the semiconductor chips transferred to the target substrate maintain their relative position with respect to one another, within the types of semiconductor chips, wherein
   on the target substrate the semiconductor chips of each type of semiconductor chips have a specific height above the mounting plane due to the platforms so that the semiconductor chips of different types of semiconductor chips have different heights,
   only after the transfer of the semiconductor chips of a first to a penultimate type of semiconductor chips and before the semiconductor chips of the respective next type of semiconductor chips are transferred, one of each type of platform is produced, and
   at least the semiconductor chips of one of the types of semiconductor chips are detached from the respective source substrate by a laser lift-off method so that a laser radiation is irradiated through the associated source substrate.

2. The method according to claim 1, wherein, in D), at least $10^4$ of the semiconductor chips are transferred per type of semiconductor chips, and three types of semiconductor chips are transferred and one of the types of semiconductor chips is configured to emit green light, one of the types is configured to emit red light and one of the types is configured to emit blue light so that RGB image points are produced.

3. The method according to claim 1, wherein n types of semiconductor chips are transferred to the target substrate, and after D), n−1 types of platforms are present on the target substrate.

4. The method according to claim 3, wherein
   the semiconductor chips are arranged in lines and within each one of the lines only semiconductor chips of the same type of semiconductor chips are arranged, and the lines follow one another with a periodicity of n,
   viewed in cross-section, in each of n consecutive lines a stairway with n−1 steps is formed and the steps are realized by the types of platforms,
   all stairways are oriented identically, and
   viewed in a plan view, a distance between adjacent semiconductor chips within the stairways is smaller than a distance between adjacent stairways.

5. The method according to claim 3, wherein the platforms are produced on the target substrate and the source substrates are free of platforms.

6. The method according to claim 5, wherein n−1 types of platforms are produced on the target substrate.

7. The method according to claim 1, wherein, in D), a potting is produced that extends to sides of the semiconductor chips of the first type of semiconductor chips facing away from the mounting plane, electrical lines for the semiconductor chips of the first type of semiconductor chips are subsequently applied to said potting and by said electrical lines, sides of the semiconductor chips of the first type of semiconductor chips facing away from the mounting plane are electrically contacted, subsequently, a planarization layer is produced that is transparent and extends up to sides of the semiconductor chips of the second type of semiconductor chips facing away from the mounting plane and further electrical lines for contacting the semiconductor chips of the second type of semiconductor chips are produced on the planarization layer, and a further planarization layer is subsequently produced that reaches until sides of the semiconductor chips of the third type of semiconductor chips facing away from the mounting plane and additional electrical lines for contacting the semiconductor chips of the third type of semiconductor chips are produced on the further planarization layer.

8. The method according to claim 1, wherein at least one of the source substrates is a growth substrate for the associated semiconductor chips, and in D), only some of the semiconductor chips originally grown onto said growth substrate are detached and transferred to the target substrate.

9. The method according to claim 1, wherein the semiconductor chips are electrically contacted with the platforms, and the semiconductor chips are electrically lined to be addressable individually and independently of one another.

10. The method according to claim 1, wherein the semiconductor chips mounted on the platforms are assigned to the platforms in a one-to-one manner.

11. The method according to claim 1, wherein, after D), a light-transmissive planarization layer is produced in E) comprising producing electrical lines for electrically contacting the semiconductor chips on the planarization layer.

12. The method according to claim 1, wherein after D), F) is carried out and comprises separating the target substrate into individual image points.

13. The method according to claim 1, wherein after D), F) is carried out and comprises separating or cutting to at least one display device having a plurality of image points.

14. The method according to claim 1, wherein at least for the semiconductor chips of the first type of semiconductor chips electrical contact areas are produced on the target substrate, the platforms are thicker by at least a factor of four than the electrical contact areas, and the electrical contact areas have a same thickness as electrical lines for electrically contacting the semiconductor chips, with a tolerance of at most a factor of two.

15. The method according to claim 1, wherein at least one of the source substrates is different from a growth substrate for the associated type of semiconductor chips so that said source substrate is a replacement carrier for said growth substrate, and said growth substrate is impermeable to the laser radiation used for said source substrate in the laser lift-off method.

16. An optoelectronic semiconductor component which is a display device or an image point, comprising:

a target substrate having a mounting plane, semiconductor chips of at least two types of radiation-emitting semiconductor chips on the target substrate, at least one platform, wherein at least one of the types of semiconductor chips is mounted on the at least one platform so that the semiconductor chips of different types of semiconductor chips have a different height above the mounting plane due to the at least one platform, and a planarization layer terminating flush with light exit sides of the semiconductor chips furthest away from the mounting plane, wherein at least one electrical line is arranged on the planarization layer.

17. The optoelectronic semiconductor component according to claim 16, which is an image point comprising a plurality of the platforms, wherein the image point comprises only one semiconductor chip that produces red light, only one semiconductor chip that generates green light and only one semiconductor chip that generates blue light, the platforms are each made of a metal or of a metal alloy, and the target substrate is a metallic carrier, a ceramic carrier, a glass carrier or a semiconductor carrier.

18. The optoelectronic semiconductor component according to claim 16, which is a display device for displaying colored images or films, wherein the display device comprises between $10^4$ and $10^8$ of the semiconductor chips, and a positioning tolerance across all semiconductor chips within each one of the types of semiconductor chips is at most 10 μm.

* * * * *